(12) United States Patent
Perugupalli et al.

(10) Patent No.: US 6,455,905 B1
(45) Date of Patent: Sep. 24, 2002

(54) SINGLE CHIP PUSH-PULL POWER TRANSISTOR DEVICE

(75) Inventors: Prasanth Perugupalli, Tempe; Larry Leighton, Scottsdale, both of AZ (US)

(73) Assignee: Ericsson Inc., Plano, TX (US)

( * ) Notice: Subject to any disclaimer, the term of this patent is extended or adjusted under 35 U.S.C. 154(b) by 0 days.

(21) Appl. No.: 09/828,098

(22) Filed: Apr. 5, 2001

(51) Int. Cl.⁷ .............................................. H01L 29/76
(52) U.S. Cl. ...................... 257/393; 257/296; 257/379; 257/390; 326/41; 326/62; 326/83; 326/87
(58) Field of Search ................................ 257/296, 379, 257/390, 532; 345/185, 186, 189, 199, 600, 589; 326/41, 62, 83, 87; 330/51, 273, 276

(56) References Cited

U.S. PATENT DOCUMENTS 4,871,928 A * 10/1989 Bushey ........................ 326/110
5,469,195 A * 11/1995 Yung et al. ................... 345/589

* cited by examiner

*Primary Examiner*—David Nelms
*Assistant Examiner*—Mai-Huong Tran
(74) *Attorney, Agent, or Firm*—Lyon & Lyon LLP (57) ABSTRACT

A push-pull transistor chip comprises a single/semiconductor die having first and second LDMOS transistors formed thereon and configured for push-pull operation, the first and second transistors sharing a common element current region. In a power transistor package, the push-pull transistor chip is attached to a mounting flange serving as a common element ground reference, wherein a conductor (e.g., one or more bond wires) electrically connects the shared common element current region to the mounting flange.

15 Claims, 11 Drawing Sheets

SINGLE CHIP PUSH-PULL POWER TRANSISTOR DEVICE

FIELD OF THE INVENTION

This invention pertains generally to the field of power transistors and, more particularly, to push-pull power transistor devices.

BACKGROUND

With the considerable recent growth in the demand for wireless services, such as personal communication services, the operating frequency of wireless networks has increased dramatically and is now well into the gigahertz frequencies. At such high frequencies, laterally diffused, metal oxide semiconductor (LDMOS) transistors have been preferred for power amplification applications, e.g., for use in antenna base stations.

Efficiency is always a major consideration when designing RF power amplifiers. Using a push-pull topology produces an amplifier with higher efficiency than a single ended design operating at comparable power and frequency levels. The two transistors in a push-pull amplifier design are operated 180 degrees out of phase. An important factor for stable operation of such high power, high frequency devices is providing a uniform ground reference potential for both of the power transistors and the surrounding circuitry. In particular, high power, high frequency power transistor devices control relatively large amounts of current. Because of the ground path losses for these currents, there is a voltage drop created, which causes signal loss, decreased efficiency, and reduced isolation between ports, which in turn reduces stability. These high currents and high voltages require that special considerations be given to the physical design of the power transistor devices and their physical integration into an amplifier system.

In order to take advantage of the desirable attributes associated with the push-pull amplifier, the characteristics of the two transistors must be quite similar. This is addressed in present day implementations by manufacturing a push-pull transistor package, which contains two transistor dies with two gate regions, two source regions and grounding of the transistor drain regions through the flange. Similarity of the two transistors is ensured by selecting transistor dies that are adjacent to each other on the wafer. This is a cumbersome and expensive task. In spite of this effort to select similar transistors, when packaged, inaccuracies associated with placement of the individual devices causes the two transistors to behave somewhat differently, degrading performance. In addition, the transistors must be placed at some minimum distance from each other. This physical separation of the device grounds degrades performance as a result of an introduction of common lead currents.

Figure 01:
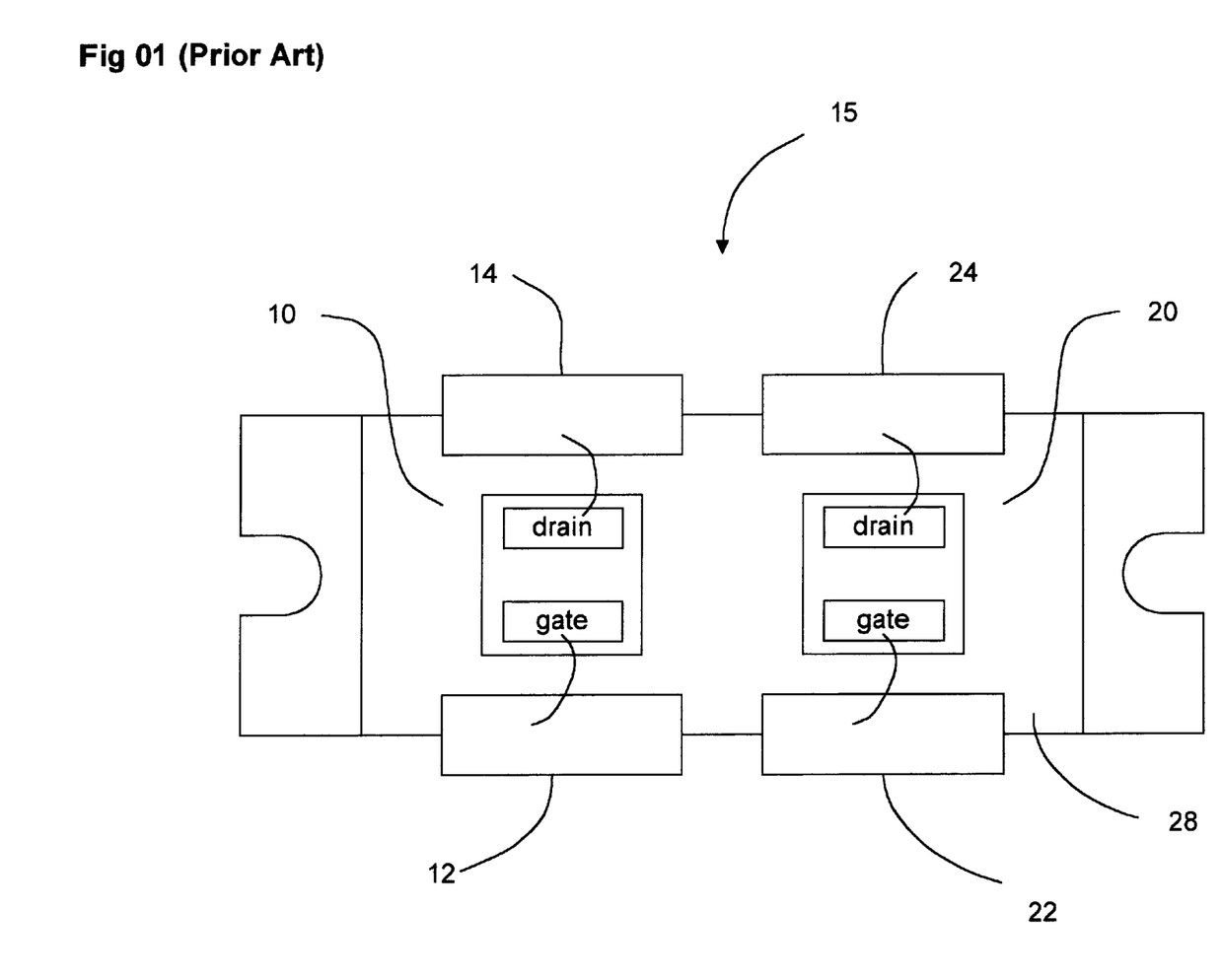
FIG. 1 is a diagram of a prior art push-pull transistor package having two transistor dies attached adjacent one another on a single mounting flange.

By way of example, FIG. 1 illustrates a prior art push-pull transistor package 15. A first LDMOS transistor chip (or "die") 10 is attached to a conductive mounting substrate (or "flange") 28 in close proximity to a second LDMOS transistor die 20, which is also attached to the flange 28. (As used herein, "chip" and "die" are synonymous). A first input (gate) lead 12 is attached to, but electrically isolated from, the mounting flange 28. The first input lead 12 is electrically connected (using a well known wirebond technique) to a gate region of the first transistor die 10. A second input (gate) lead 22 is attached to, but electrically isolated from, the mounting flange 28 adjacent the first input lead 12. The second input lead from 22 is electrically connected to a gate region s of the second transistor die 20. A first output (drain) lead 14 is attached to, but electrically isolated from, the mounting flange 28 and electrically connected to a drain region of the first transistor die 10. A second output (drain) lead 24 is attached to, but electrically isolated from, the mounting flange 28 adjacent the first output lead 14, and electrically connected to a drain region of the second transistor die 20. Common element (source) regions located on the undersides of the first and second transistor dies 10 and 20 are directly connected to the mounting flange 28, such that the flange 28 acts as a combined support structure, heat sink, and ground reference.

Figure 02:
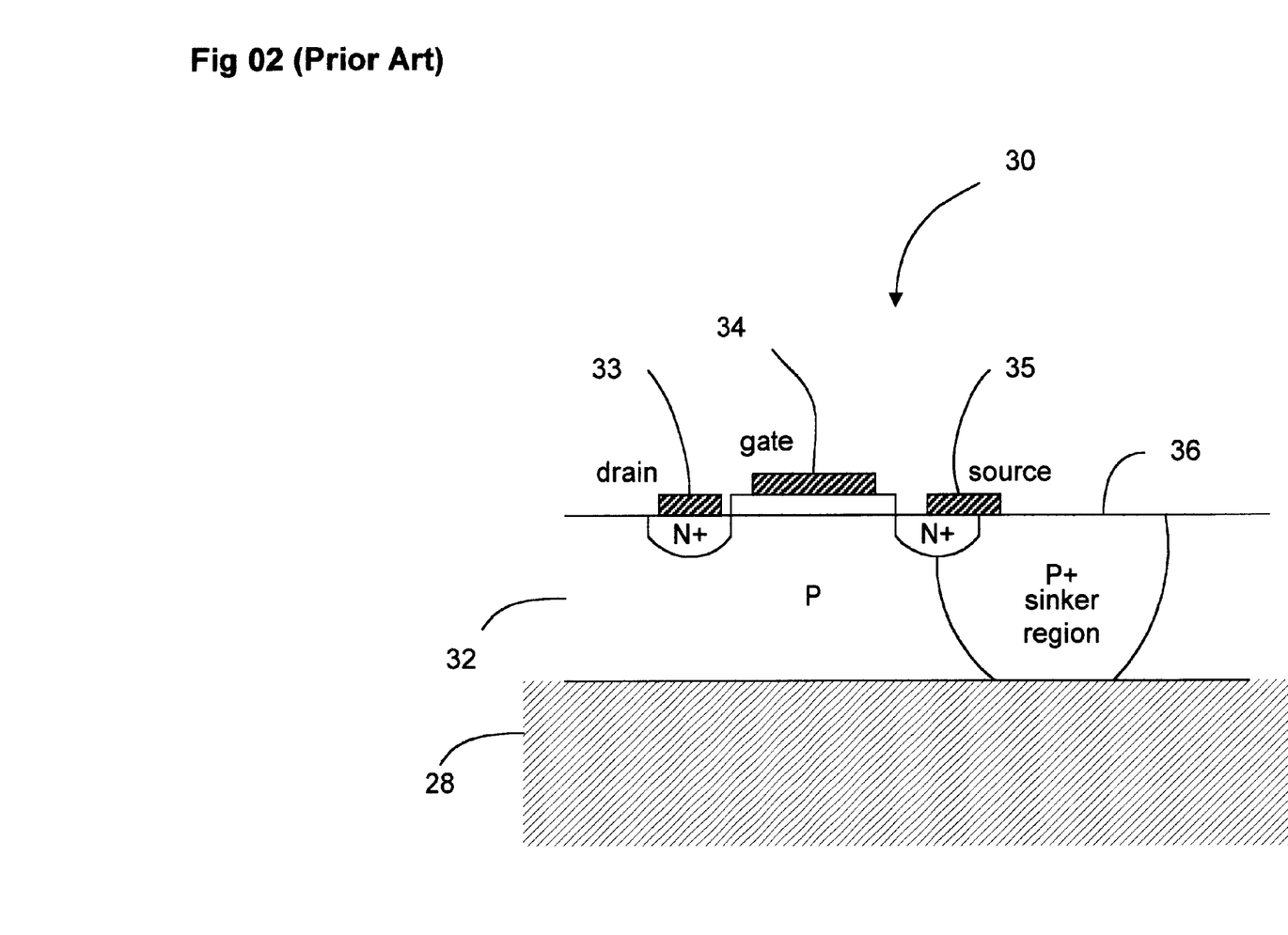
FIG. 2 is a diagram of a prior art LDMOS transistor die with a sinker region.

Present day LDMOS transistors use a heavily doped sinker region for grounding the source region of the transistor to the flange. By way of illustration, FIG. 2 is a side view of a LDMOS transistor die 30, which is representative of transistor dies 10 and 20 in the package 15 of FIG. 1. The transistor die 30 includes an input (gate) region 34, output (drain) region 33, and common element source region 35 formed on a semiconductor (e.g., silicon) die 32, which is shown attached to a metal mounting flange 28. A heavily doped sinker region 36 forms a electrical conduction path for the common element current from the source region 35, through the die 32, to the flange 28, which represents a ground reference for the transistor device 30. The sinker region 36 is typically formed by extensive diffusion after a high dosage implant on the top side of the transistor device 30. In particular, the sinker region 36 provides a common element current path having a minimal resistance and low inductance. Present day transistors for such applications use a large epitaxial region of about nine microns in thickness for supporting high breakdown voltages. The associated lateral diffusion in the sinker region can occupy as much as seven microns. This corresponds to about half of the total width of the transistor, and consequently increases the die size.

SUMMARY OF THE INVENTION

In accordance with one aspect of the invention, a more optimal performance of a push-pull RF transistor device is achieved by fabricating both transistors in an interdigitated fashion on a single semiconductor die.

In one embodiment, a push-pull transistor device comprises a single chip having first and second transistors formed thereon and configured for push-pull operation, the first and second transistors sharing a common element current region. In some embodiments, the first and second transistors each have a plurality of conduction regions, each conduction region formed by adjacent gate and drain regions of the respective transistor, wherein conduction regions of the first transistor are interleaved with conduction regions of the second transistor.

In another embodiment, a push-pull transistor package comprises a mounting substrate providing a combined support structure and common element ground reference. A single chip having first and second transistors formed thereon and configured for push-pull operation is attached to the mounting substrate, the first and second transistors sharing a common element current region. A conductor, e.g., one or more bond wires, electrically connects the shared common element current region to the mounting substrate.

In alternate embodiments, a low resistance doped path through the device may be used to electrically connect the shared common element current region to the mounting substrate. Also, in alternate embodiments, the common element ground reference may be different than the mounting substrate for the chip, in which case the conductor electrically connects the shared common element current region to the actual ground reference.

Other aspects and features of the invention will become apparent hereinafter.

BRIEF DESCRIPTION OF THE DRAWINGS

The drawings illustrate both the design and utility of preferred embodiments of the present invention, in which similar elements in different embodiments are referred to by the same reference numbers for purposes of ease in illustration, and wherein.

DETAILED DESCRIPTION OF THE PREFERRED EMBODIMENTS

Figure 03:
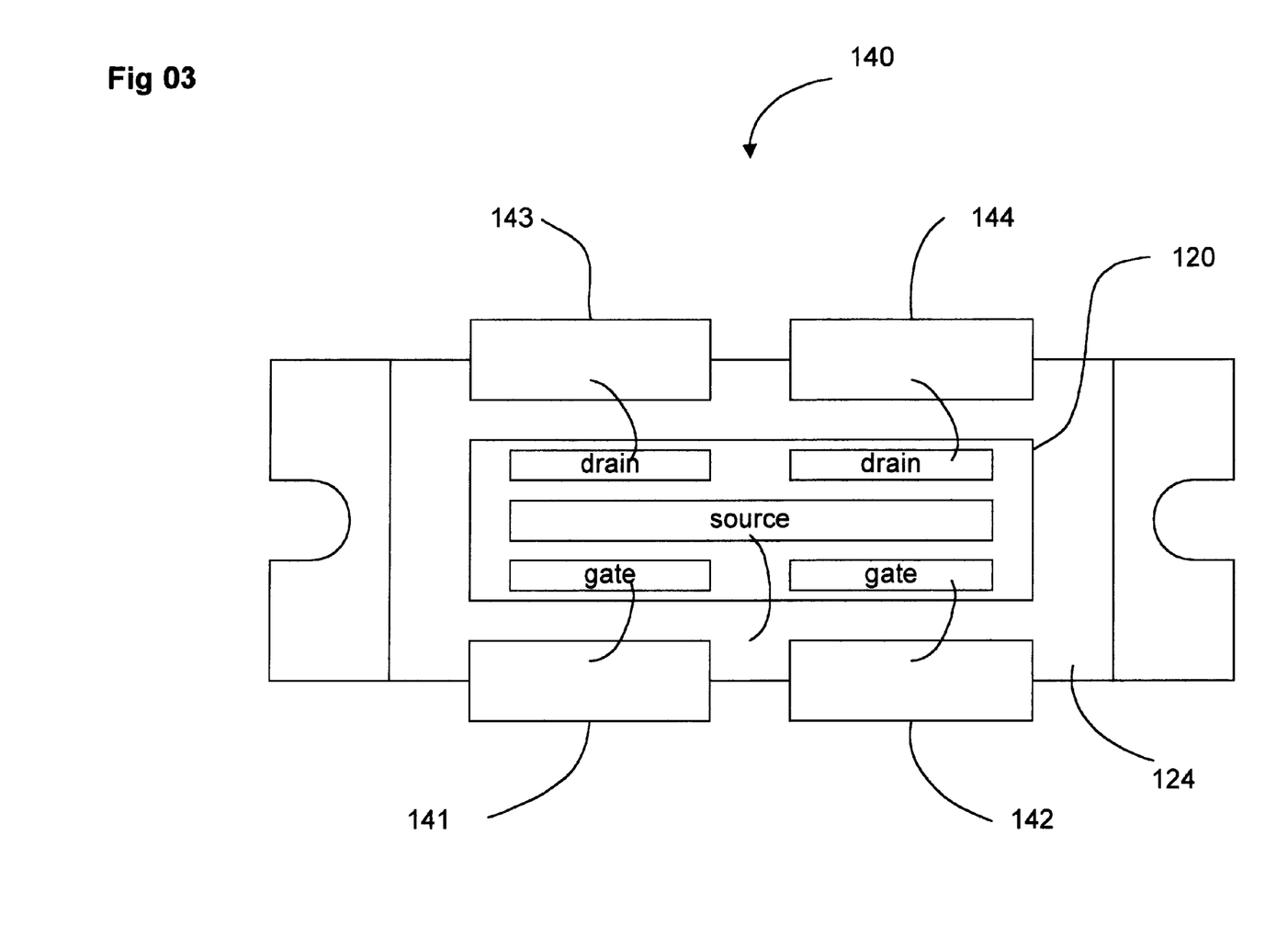
FIG. 3 is a simplified plan view of a RF power amplifier package employing a first preferred push-pull transistor device having two transistors formed in a single die, in accordance with the present invention.

Referring to FIG. 3, in accordance with a first aspect of the invention, a five terminal RF power amplifier package 140 employs a first preferred push-pull transistor chip 120 attached to a mounting flange 124. Attached to, but electrically isolated from, a first side of the flange 124 are a first input (gate) lead 141, and a second input (gate) lead 142. Attached to an opposite side of, and electrically isolated from, the flange 124 are a first output (drain) lead 143, and a second output (drain) lead 144.

Figure 04:
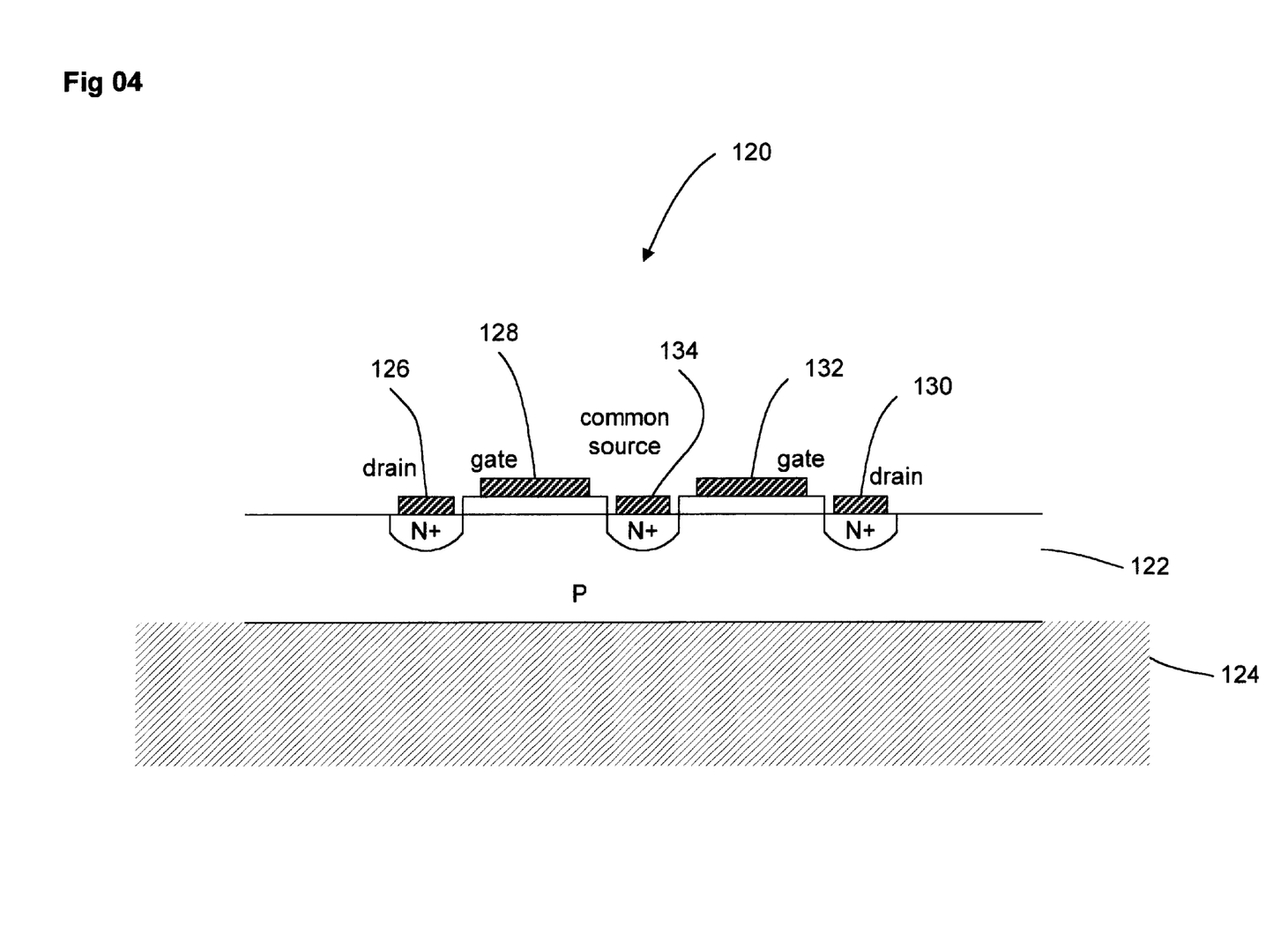
FIG. 4 is a cross-section of the push-pull transistor device of FIG. 3.

Referring also to FIG. 4, the transistor chip 120 includes two LDMOS transistors having similar characteristics formed on a single semiconductor die 122. The first transistor includes a drain region 126 and gate region 128, and the second transistor includes a drain region 130 and gate region 132, respectively, with the two transistors formed on opposite sides of a shared source region 134. The first and second input leads 141 and 142 are electrically connected via wire bond conductors to the respective first and second gate regions 128 and 132. Similarly, the first and second output leads 143 and 144 are electrically connected via wire bond conductors to the respective first and second drain regions 126 and 130. The shared source region 134 is electrically connected via a wire bond conductor to the surface of the mounting flange 124. In alternate embodiments, the shared source region 134 may be electrically coupled to the flange 124 through the device itself, e.g., using a highly doped path through the die 122.

Figure 05:
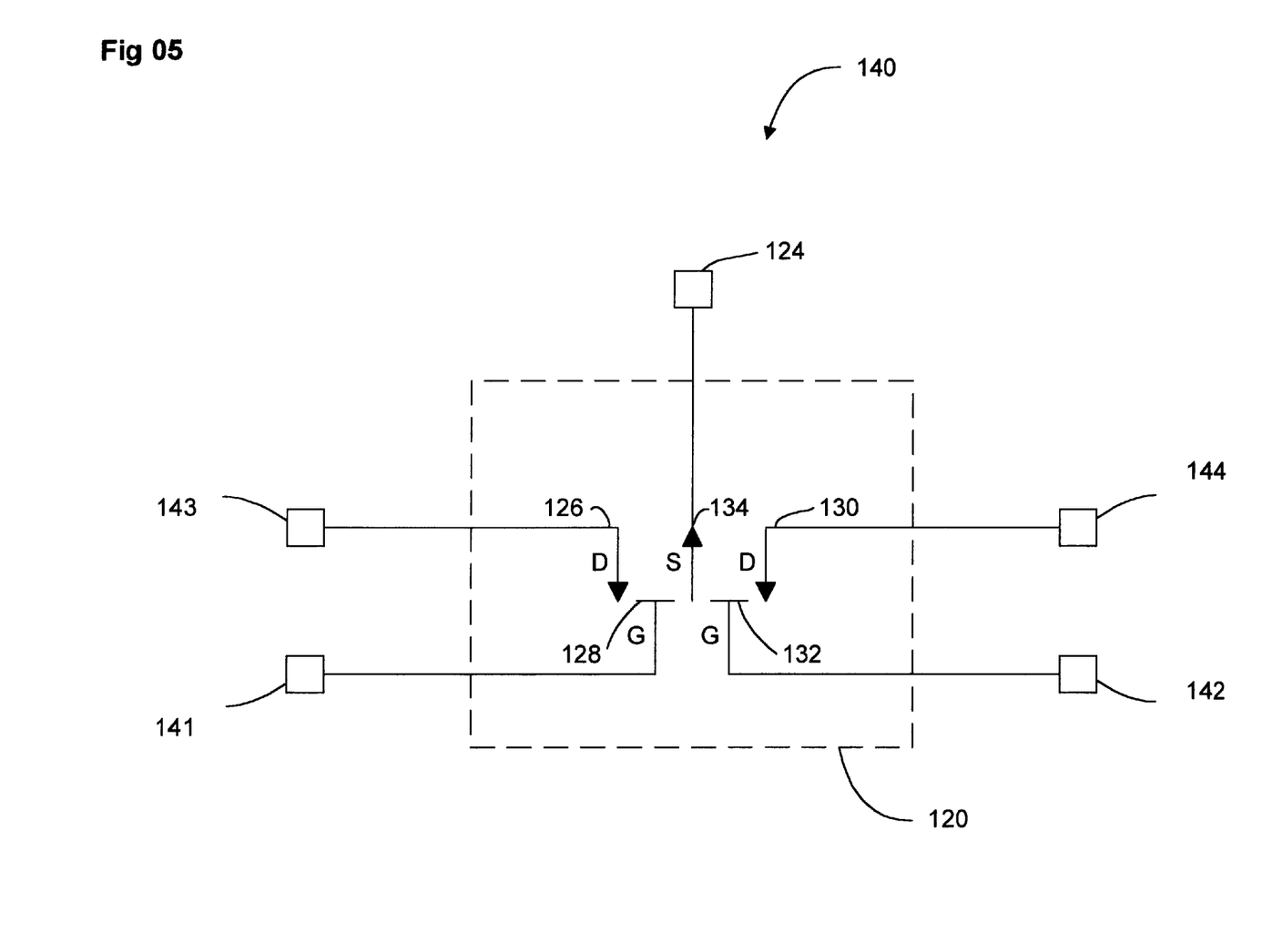
FIG. 5 is a schematic representation of the amplifier package of FIG. 3.

With reference also to FIG. 5, when an activating voltage is applied to the first gate region 128 (via lead 141), electrical conduction occurs from the first drain region 126 (via lead 143) to the common source region 134. Similarly, when an activating voltage is applied to the second gate region 132 (via lead 142), electrical conduction occurs from the second drain region 130 (via lead 144) to the common source region 134 and, ultimately, the "ground reference" flange 124. In alternate transistor package embodiments, the common element ground reference may be different than the mounting flange 124, in which case the source region 134 is electrically connected to the actual ground reference instead of the flange 124.

This geometry for fabricating the two transistors on a single die 122 eliminates the need for sinker region in the vicinity of the source region 134 by formation of a "virtual ground" within the device. This virtual ground is a result of the two gate signals applied to leads 141 and 142 being 180 degrees out of phase and of equal amplitude, and provides a local alternating current (AC) ground, or null point, that is independent of the inherent resistance and inductance in the common lead current path. Instead, the common lead current path need only provide an adequate direct current (DC) path to ground for the transistors, providing for higher frequency performance and enhanced stability of the device 140, which is relatively insensitive to the physical placement of the transistors on the semiconductor die 122 relative to the flange 124 and/or the general magnitude of the inherent resistive and inductive elements of the common lead current path. A particular advantage of not having a sinker region is that the power density per chip is significantly higher, thereby reducing the size of the semiconductor die. Even order distortion products are cancelled at the shared source region 134, whereas the odd order distortion products create a voltage drop.

Notably, the transistor chip 120 is shown as an n-channel device, but this construction is by example and does not limit the invention. It will be apparent to those skilled in the art that each of the push-pull transistor device embodiments disclosed herein could be fabricated with opposite polarity; i.e., a p-channel device and remain within the scope of the invention. It will also be apparent to those skilled in the art that the transistor device geometry depicted in the Figures is representative only and is not necessarily to scale.

In order to extend the power handling capability of a push-pull transistor device, it would be desirable to have multiple conduction channels operating essentially in parallel. With such a device, activation of the first gate lead 141 will facilitate conduction from the first drain lead 143 to flange 124, while still maintaining isolation of the second drain lead frame 144.

Figure 06:
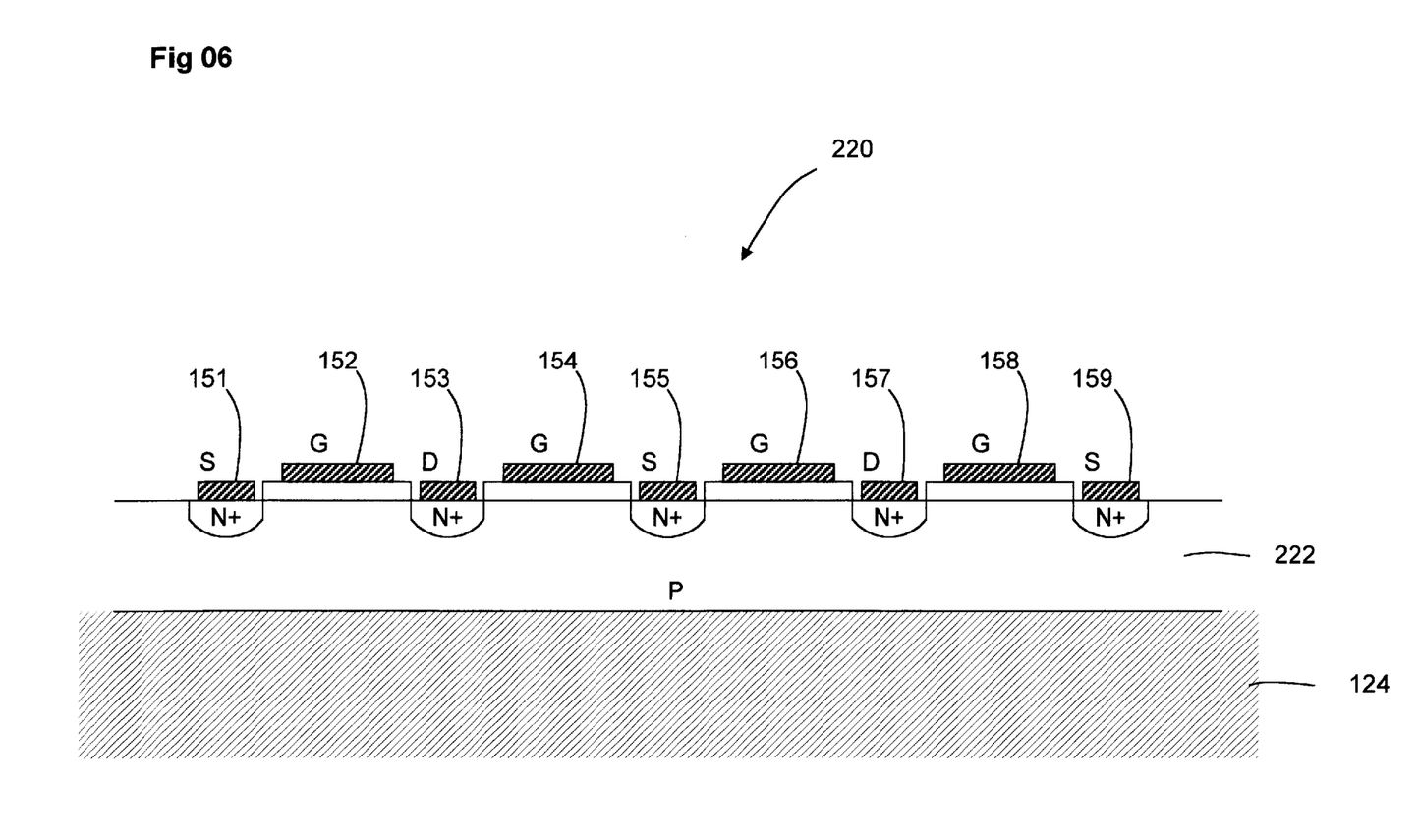
FIG. 6 is a cross-section of a further preferred push-pull transistor device, having multiple channels, for use in the RF power amplifier package of FIG. 3.

Towards this end, FIG. 6, is an alternate preferred push-pull transistor chip 220 for use in the five terminal package 140. The transistor chip 220 comprises first and second LDMOS transistors, each having multiple channels operated in parallel, fabricated on a single semiconductor die 222. The first transistor has a source region 151, a drain region 153, and first and second gate regions 152 and 154 disposed on opposite sides of the drain region 153. The second transistor has a source region 159, a drain region 157, and first and second gate regions 158 and 156 disposed on opposite sides of the drain region 157. The two transistors also share a common source region 155.

Figure 07:
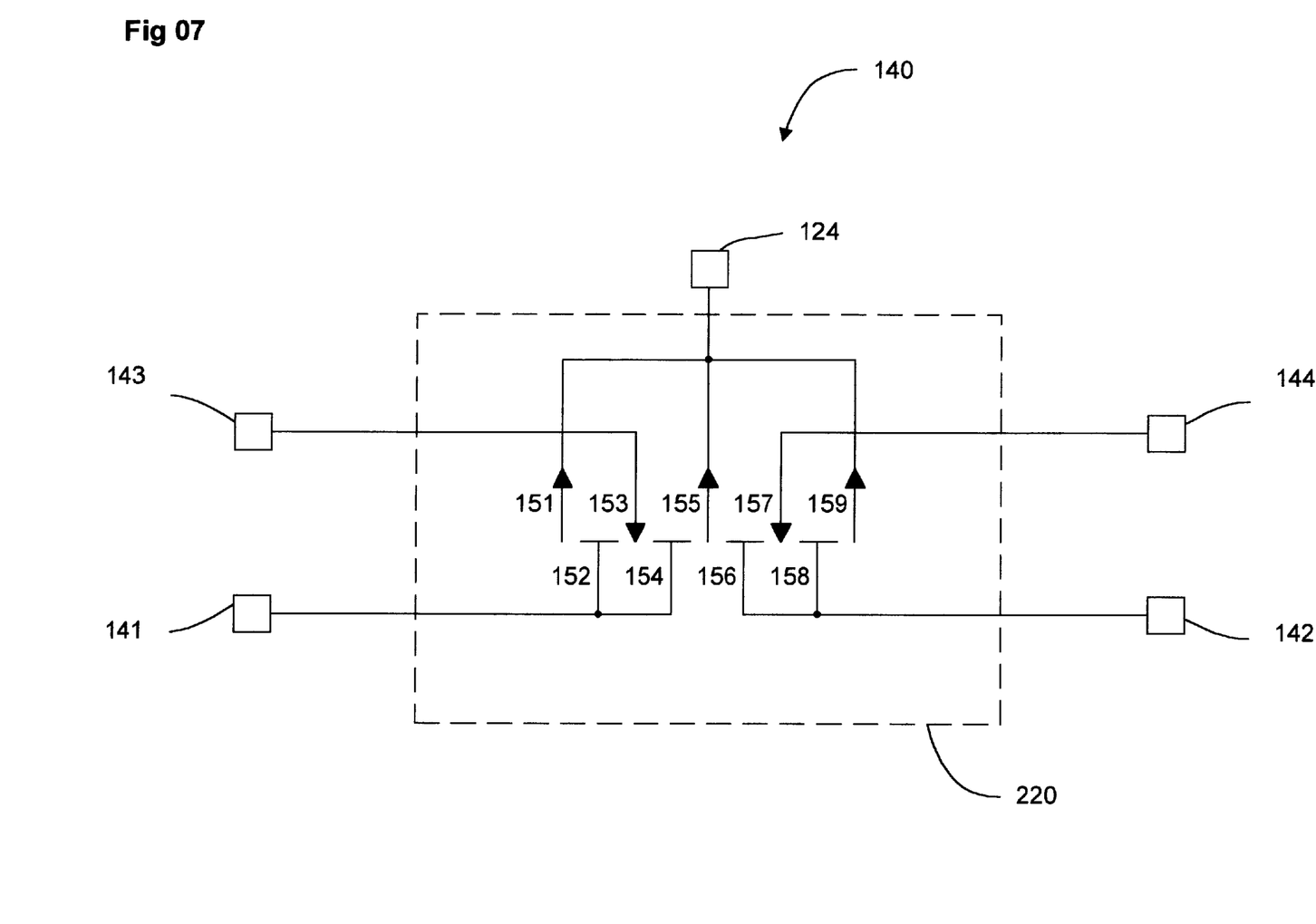
FIG. 7 is a schematic representation of the amplifier package of FIG. 3, employing the push-pull transistor device of FIG. 6.
Figure 08:
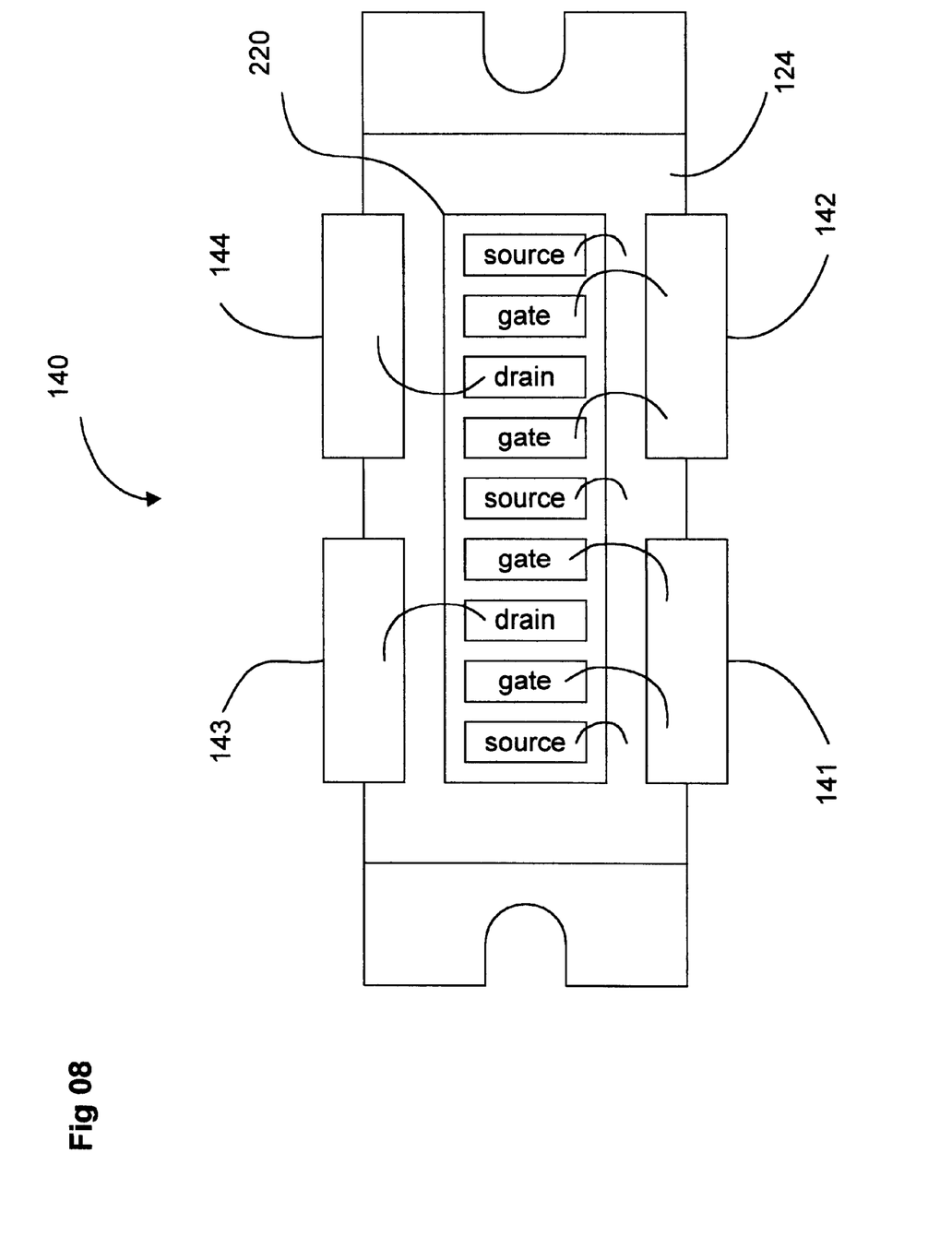
FIG. 8 is a simplified plan view of the amplifier package of FIG. 3, employing the push-pull transistor device of FIG. 6.

With reference also to FIGS. 7 and 8, the drain region 153 is electrically connected to the first drain lead 143, and the first and second gate regions 152 and 154 are electrically coupled to the first gate lead 141. Similarly, drain region 157 of the second transistor is electrically coupled to the second drain lead 144, and gate regions 156 and 158 are electrically coupled to the second gate lead 142. Each of the source regions 151, 155 and 159 are electrically coupled via wire bands to the surface of the flange 124. In alternate embodiments, the shared source regions 151, 155, and 159 may be electrically coupled to the flange 124 through the device itself, e.g., using a highly doped path through the die 222.

Each of the first and second transistors have double conduction channels. The first transistor uses gate regions 152 and 154 to activate two conduction channels. When activating voltage is applied to the first input lead 141, electrical conduction is facilitated between drain region 153 and source region 151, and between drain region 153 and source region 155, respectively. This, in turn, facilitates electrical conduction from the first output lead 143 to the flange 124 (as seen in FIG. 7). In alternate transistor package embodiments, the common element ground reference may be different than the mounting flange 124, in Which case the source regions 151, 155 and 159 are electrically connected to the actual ground reference instead of the flange 124.

Similarly, the second transistor uses gate regions 156 and 158 to activate two conduction channels. When an activating voltage is applied to the second input lead 142, electrical conduction is facilitated between drain region 157 and the common source region 155, and between drain region 157 and source region 159, respectively. This, in turn, facilitates electrical conduction between the second drain lead 144 and the flange 124.

Figure 09:
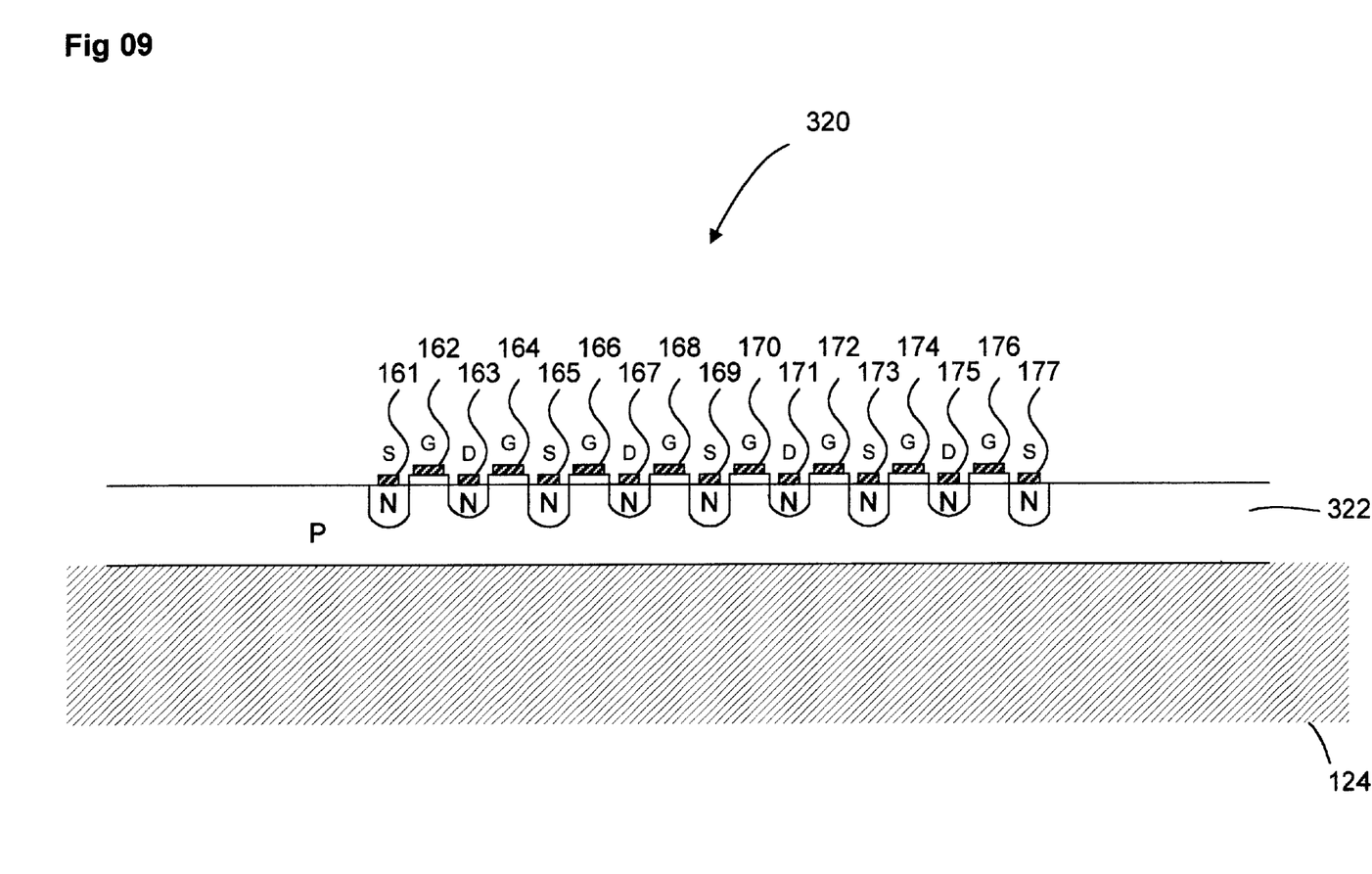
FIG. 9 is a cross-section of a still further preferred push-pull transistor device, having multiple interleaved channels, for use in the RF power amplifier package of FIG. 3.

In accordance with a yet another aspect of the invention, a push-pull transistor device can be fabricated having further conduction channels in the first transistor, which are added in pairs and interleaved with corresponding channels added to the second transistor. This concept is illustrated in FIG. 9, which depicts a further push-pull transistor chip 320 similar to that of FIG. 6, with two additional first transistor conduction channels interleaved with two additional second transistor conduction channels, respectively, all formed on a single die 322.

In particular, the transistor chip 320 includes a first transistor having first, second, third and fourth gate regions 162, 164, 170 and 172, respectively, and first and second drain regions 163 and 171. The device includes a second transistor having first, second, third, and fourth gate regions 166, 168, 174, and 176 respectively, and first and second drain regions 167 and 175. The two transistors share source regions 161, 165, 169, 173 and 177, with each transistor having double interleaved conduction channels on each side of drain region 171.

Figure 10:
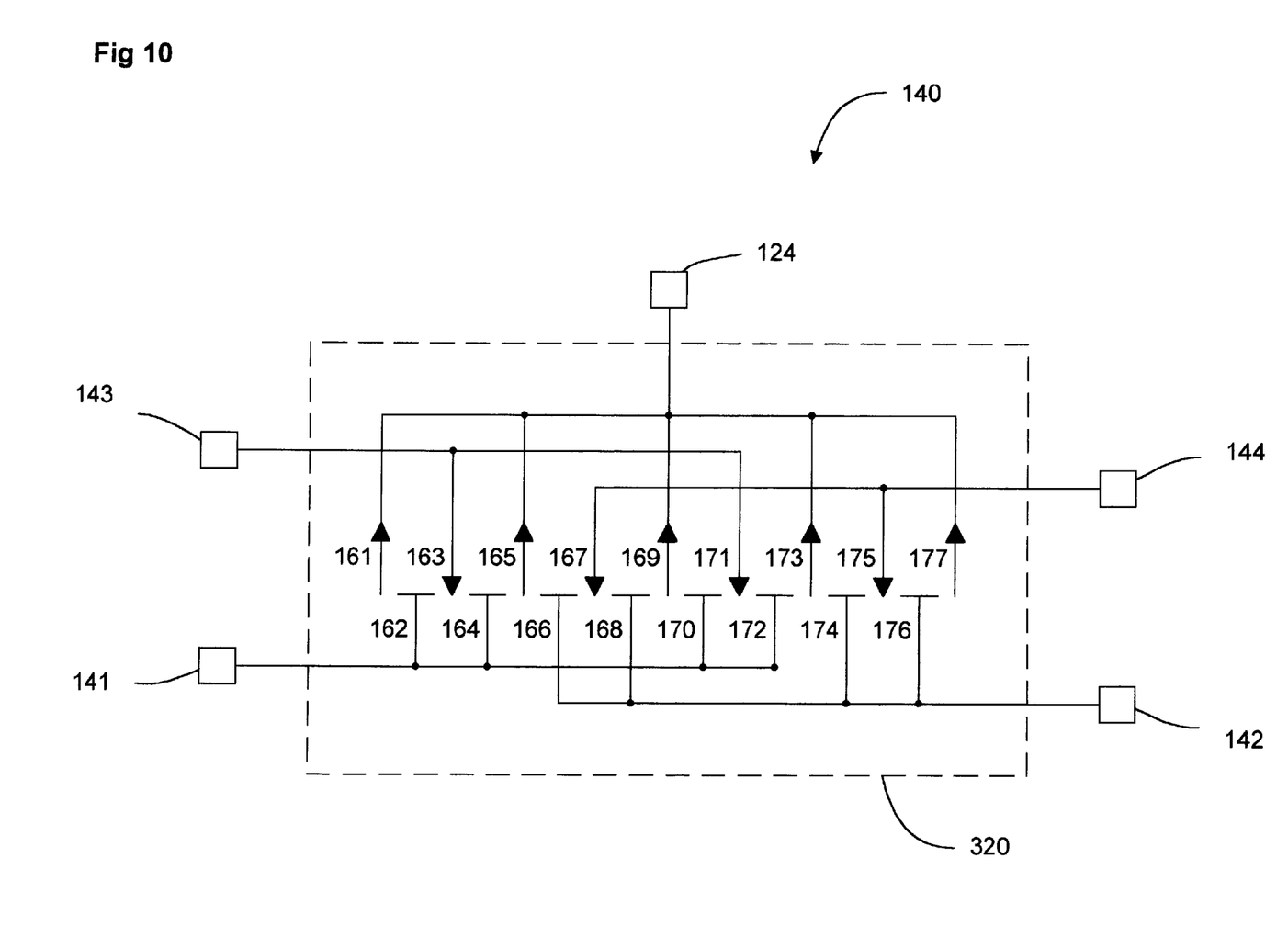
FIG. 10 is a schematic representation of the amplifier package of FIG. 3 employing the push-pull transistor device of FIG. 9.
Figure 11:
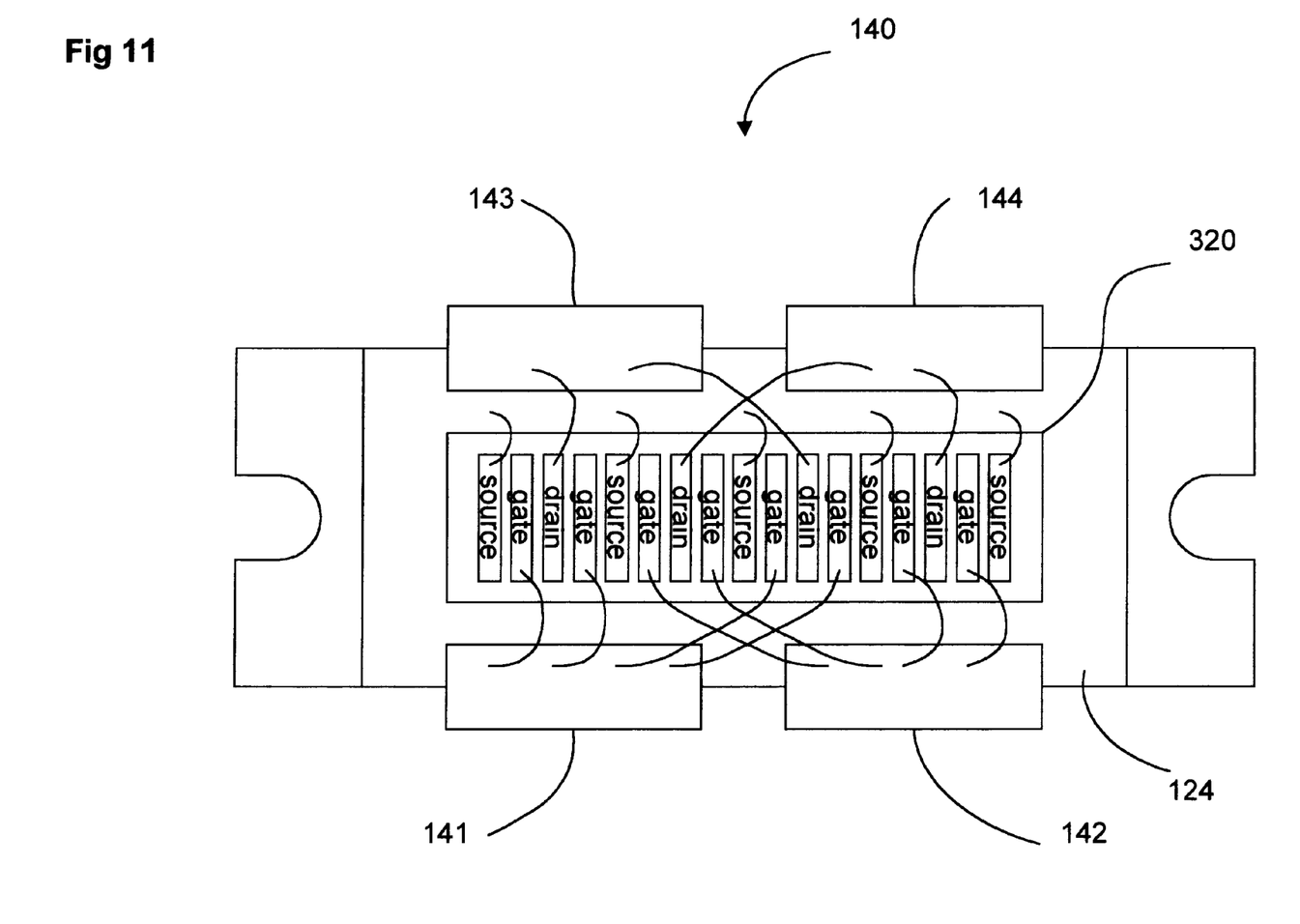
FIG. 11 is a simplified plan view of the amplifier package of FIG. 3, employing the push-pull transistor device of FIG. 9.

With reference to FIGS. 10 and 11, the first and third drain regions 163 and 171 are electrically coupled to the first output lead 143. The second and fourth drain regions 167 and 175 are electrically coupled to the second output lead 144. The first, second, fifth and sixth gate regions 162, 164, 170 and 172 are electrically coupled to the first input lead 141. The third, fourth, seventh and eighth gate regions 166, 168, 174 and 176 are electrically coupled to the second input lead 142. The first, second, third, fourth and fifth source regions 161, 165, 169, 173, and 177 are electrically coupled to the surface of the flange 124. In alternate embodiments, the shared source regions 161, 165, 169, 173, and 177 may be electrically coupled to the flange 124 through the device itself, e.g., using a highly doped path through the die 322.

The first transistor uses the first, second, fifth and sixth gate regions 162, 164, 170 and 172 to activate its four conduction channels. When activating voltage is applied to first input lead 141, electrical conduction is facilitated between drain region 163 and source regions 161 and 165, as well as between drain region 171 and source regions 169 and 173. This, in turn, facilitates electrical conduction from the first output lead 143 to the flange 124.

Similarly, the second transistor uses the third, fourth, seventh and eighth gate regions 166, 168, 174 and 176, respectively, to activate its four conduction channels. When activating voltage is applied to the second input lead 142, electrical conduction is facilitated between the second drain 167 and second source 165, second drain 167 and third source 169, and between the fourth drain 175 and fourth source 173, the fourth drain 175 and fifth source 177, respectively. This, in turn, facilitates electrical conduction between the second drain lead 144 and the flange 124. In alternate transistor package embodiments, the common element ground reference may be different than the mounting flange 124, in which case the source regions 161, 165, 169, 173, and 177 are electrically connected to the actual ground reference instead of the flange 124.

It will be apparent to those skilled in the art that this concept can be extended to further interleaving pairs of conduction channels in the push-pull transistor devices. Also those skilled in the art will recognize that transistors other than LDMOS transistors, for example, bipolar power transistors, may be used in push-pull configuration in accordance with the above teachings.

Accordingly, the invention is not to be restricted, except in light of the claims and their equivalents.

What is claimed:

1. A push-pull transistor package, comprising:
 a mounting substrate;
 a semiconductor die attached to the mounting substrate, the die having first and second transistors formed thereon and configured for push-pull operation, the first and second transistors sharing a common element current region; and
 a conductor electrically connecting the shared common element current region to a ground reference.

2. The push-pull transistor package of claim 1, wherein the conductor comprises one or more bond wires.

3. The push-pull transistor package of claim 1, wherein the ground reference is the mounting substrate.

4. The push-pull transistor package of claim 1, wherein the first and second transistors are LDMOS transistors.

5. The push-pull transistor package of claim 1, the first and second transistors each comprising a plurality of conduction regions, each conduction region formed by adjacent gate and drain regions of the respective transistor, conduction regions of the first transistor being interleaved with conduction regions of the second transistor.

6. The push-pull transistor package of claim 4, the first and second transistors sharing at least three common element current regions, respective conductors electrically connecting each of the shared common element current regions to the ground reference.

7. A push-pull transistor chip, comprising:
a semiconductor die having first and second transistors formed thereon and configured for push-pull operation, the first and second transistors sharing a common element current region.

8. The push-pull transistor chip of claim 7, wherein the first and second transistors are LDMOS transistors.

9. The push-pull transistor chip of claim 7, the first and second transistors each comprising a plurality of conduction regions, each conduction region formed by adjacent gate and drain regions of the respective transistor, conduction regions of the first transistor being interleaved with conduction regions of the second transistor.

10. The push-pull transistor chip of claim 9, the first and second transistors sharing at least three common element current regions.

11. A push-pull transistor package, comprising:
a mounting substrate providing a common element ground reference;
first and second input leads attached to, but electrically isolated from, a first side of the mounting substrate;
first and second output leads attached to, but electrically isolated from, a second side of the mounting substrate;
a semiconductor die attached to the mounting substrate, the die having first and second transistors formed thereon and configured for push-pull operation, the first and second transistors sharing a common element current region; and
a plurality of conductors, with
one or more conductors electrically connecting one or more corresponding gate regions of the first transistor to the first input lead,
one or more conductors electrically connecting one or more corresponding gate regions of the second transistor to the second input lead,
one or more conductors electrically connecting one or more corresponding drain regions of the first transistor to the first output lead,
one or more conductors electrically connecting one or more corresponding drain regions of the second transistor to the second output lead, and
a conductor electrically connecting the shared common element current region to the mounting substrate.

12. The push-pull transistor package of claim 11, wherein each conductor comprises one or more bond wires.

13. The push-pull transistor package of claim 11, wherein the first and second transistors are LDMOS transistors.

14. The push-pull transistor package of claim 11, the first and second transistors each comprising a plurality of conduction regions, each conduction region formed by adjacent gate and drain regions of the respective transistor, conduction regions of the first transistor being interleaved with conduction regions of the second transistor.

15. The push-pull transistor package of claim 14, the first and second transistors sharing at least three common element current regions, with respective conductors electrically connecting each shared common element current region to the mounting substrate.

* * * * *